(12) United States Patent
Eisner et al.

(10) Patent No.: US 12,713,514 B2
(45) Date of Patent: Aug. 18, 2026

(54) ELECTRONIC ASSEMBLY AND SEMICONDUCTOR SWITCHING DEVICE

(71) Applicant: Siemens Aktiengesellschaft, Munich (DE)

(72) Inventors: Matthias Eisner, Neukirchen (DE); Nina Müller, Amberg (DE); Julian Stefan Breiter, Regensburg (DE); Martin Heimler, Trisching (DE)

(73) Assignee: Siemens Aktiengesellschaft, Munich (DE)

( * ) Notice: Subject to any disclaimer, the term of this patent is extended or adjusted under 35 U.S.C. 154(b) by 252 days.

(21) Appl. No.: 18/619,668

(22) Filed: Mar. 28, 2024

(65) Prior Publication Data

US 2024/0334587 A1 Oct. 3, 2024

(30) Foreign Application Priority Data

Mar. 28, 2023 (DE) ..................... 10 2023 202 803.4

(51) Int. Cl.
*H05K 1/02* (2006.01)
*H05K 1/11* (2006.01)
(Continued)

(52) U.S. Cl.
CPC ........... *H05K 1/0203* (2013.01); *H05K 1/115* (2013.01); *H05K 1/181* (2013.01);
(Continued)

(58) Field of Classification Search
CPC ........... H05K 7/20909; H05K 7/20145; H05K 7/2039; H05K 7/20172; H05K 1/0203; H05K 1/181; H05K 1/115; H05K 2201/064; H05K 2201/066; H05K 7/20; H05K 7/2019; H05K 7/20154; H05K 7/20209; H05K 7/20409; H05K 7/20509;
(Continued)

(56) References Cited

U.S. PATENT DOCUMENTS 5,828,549 A * 10/1998 Gandre ................. H01L 23/467 165/185
5,946,188 A * 8/1999 Rochel ............... H05K 7/20863 174/16.3

(Continued)

FOREIGN PATENT DOCUMENTS

| DE | 112016003428 B4 | 10/2022 |
|---|---|---|
| EP | 3490352 B1 | 11/2020 |

*Primary Examiner* — Michael A Matey

(74) *Attorney, Agent, or Firm* — Laurence A. Greenberg; Werner H. Stemer; Ralph E. Locher

(57) ABSTRACT

An electronic assembly has a circuit board and two or more heat sinks arranged on the printed circuit board, each having a straight air duct section from an air inlet opening of the heat sink to an air outlet opening of the heat sink. The heat sinks are spaced apart from each other one behind another in a row by intervening spaces, with their air duct sections lying in a straight line and forming an air duct. Through-hole-mounted THT components, which in each case rest against an outside surface of one of the heat sinks, have connecting pins secured in the printed circuit board. A fan generates an air stream that enters the air inlet opening of the heat sink that is located at the beginning of the row and flows through the air duct.

10 Claims, 7 Drawing Sheets

(51) Int. Cl.
*H05K 1/18* (2026.01)
*H05K 1/181* (2026.01)
*H05K 7/20* (2006.01)

(52) U.S. Cl.
CPC ... *H05K 7/20145* (2013.01); *H05K 2201/064* (2013.01); *H05K 2201/066* (2013.01)

(58) Field of Classification Search
CPC .. H05K 7/20863; H05K 7/2089; H05K 7/209; H10W 40/43; H10W 40/226; G06F 1/20; H02K 1/20; F04D 29/5806; F04D 25/166; F16C 32/0474; F28F 1/02
See application file for complete search history.

(56) References Cited

U.S. PATENT DOCUMENTS 6,515,858 B2 * 2/2003 Rodriguez ......... H05K 7/20909 174/16.3
7,180,739 B2 * 2/2007 Kajiura .............. H05K 7/20918 174/16.3
7,315,450 B2 * 1/2008 Ishii ...................... H01L 23/467 174/16.3
7,729,119 B2 * 6/2010 Yang ..................... H01L 23/467 257/714
11,195,648 B2 * 12/2021 Fukuchi .................. H01F 27/08
11,259,439 B2 2/2022 Kaesbauer et al.
12,302,528 B2 * 5/2025 Ma ..................... H05K 7/20163
2002/0170905 A1 * 11/2002 Peterson ............ H05K 7/20918 219/443.1
2006/0039110 A1 * 2/2006 Foster ................... H01L 23/467 257/E23.099
2007/0091566 A1 * 4/2007 Sun ........................... G06F 1/20 361/695
2007/0215329 A1 * 9/2007 Schwab ............. H05K 7/20918 165/122
2007/0247811 A1 * 10/2007 Ohmi ................. H05K 7/20909 361/697
2010/0232106 A1 * 9/2010 Kauranen .......... H05K 7/20918 361/699
2011/0292611 A1 12/2011 Higuchi et al.
2013/0039008 A1 * 2/2013 Hoffmann .......... H05K 7/20909 361/692
2017/0163125 A1 * 6/2017 Granat ..................... H02K 9/18
2019/0277337 A1 * 9/2019 Tzianetopoulou .... F16C 37/005
2020/0288599 A1 * 9/2020 Kaesbauer ......... H05K 7/20909
2020/0375063 A1 * 11/2020 Reichenbach ....... H05K 7/2089
2021/0226467 A1 * 7/2021 Chien-An ................. H02J 7/65
2022/0393557 A1 * 12/2022 Deeg ...................... H02K 11/33
2023/0262936 A1 * 8/2023 Hsue .................... H05K 7/2039 361/720
2024/0188254 A1 * 6/2024 Weis .................. H05K 7/20509
2025/0008708 A1 * 1/2025 Parker ................ H05K 7/20918

* cited by examiner 100
13
16
10
4,4.1,40
8
8
13
13
4,4.6,40
10
12
11
14
13
2

4
D
4
10
6
8
6
60
60
2

4
24
4
22
16
22
6
8
6
60
60

4
20
4
22
22
16
6
8
6
60
60
60
2

100
6b
8,20
4.6
4.5
4.4
4,40
4.3
4.2
4.1
8,20
2
8,20
16

ELECTRONIC ASSEMBLY AND SEMICONDUCTOR SWITCHING DEVICE

CROSS-REFERENCE TO RELATED APPLICATION

This application claims the priority, under 35 U.S.C. § 119, of German patent application DE 10 2023 202 803.4, filed Mar. 28, 2023; the prior application is herewith incorporated by reference in its entirety.

FIELD AND BACKGROUND OF THE INVENTION

The present invention relates to an electronic assembly and a semiconductor switching device having such an electronic assembly.

The greatest heat source in an SC switching device is the power semiconductors that are installed in it (SC=semiconductor). The thermal energy released by the power semiconductors during continuous operation or during motor start-up is a critical factor in the design of electronic and mechanical components and for the classification of the operating conditions such as rated current, starting current and maximum permissible ambient temperature. In order to dissipate the heat generated in an SC switching device, heat dissipation by free convection is usually sufficient at low currents; at higher currents, a fan is often required to achieve higher heat dissipation by forced convection.

At higher currents, heat sinks, which are usually made of a metal such as aluminum, may also be required. Such a heat sink is arranged on a power semiconductor in such a way that heat conduction from the power semiconductor to the heat sink is possible. Depending on the design of the heat sinks, this can result in one or more of the following disadvantages:

- The heat sink can have such a large space requirement that the dimensions of the SC switching device become undesirably large.
- The heat sink can cause heat dissipation through the printed circuit board, which may adversely affect other electronic components of the SC switching device.
- The heat sink can cause turbulence in the air stream generated by the fan. Such a turbulent flow along the heat sink, however, provides inadequate air flow, causing insufficient cooling of the heat sources of the SC switching device that are furthest away from the fan.
- The heat sink can lead to asymmetric cooling of the SC switching device, with a warm side and a cold side.

SUMMARY OF THE INVENTION

It is accordingly an object of the invention to provide an electronic device which overcomes the above-mentioned disadvantages of the heretofore-known devices and methods of this general type and which provides for improved heat dissipation from a semiconductor switching device.

With the above and other objects in view there is provided, in accordance with the invention, an electronic assembly, comprising:

- a circuit board;
- two or more heat sinks disposed on said printed circuit board, each of said heat sinks having a straight air duct section extending from an air inlet opening of said heat sink to an air outlet opening of said heat sink,
- said heat sinks being disposed in a row, one behind another, and spaced apart from each other by intermediate spaces, with said air duct sections lying in a straight line and forming an air duct,
- through-hole-technology (THT) components each having an outer side resting against an outside surface of a respective one of said heat sinks and having connecting pins secured in said circuit board; and
- a fan disposed to generate an air stream to enter the air inlet opening of a respective said heat sink that is located at a beginning of said row, and to flow through the air duct.

In other words, the electronic assembly has a printed circuit board. The printed circuit board may have contact holes that are suitable for receiving connection pins of electronic components. The contact holes are through holes that run transversely to the plane of the printed circuit board. The electronic assembly has two or more heat sinks arranged on the printed circuit board. The heat sinks consist of a thermally conducting material. This may be a metallic material, preferably an easy-to-machine and relatively lightweight metal such as aluminum. However, the heat sinks may also consist of a non-metallic material, e.g., a thermally conductive polymer, preferably a polymer with additives which increase the thermal conductivity of the polymer. The heat sinks each have a straight air duct section leading from an air inlet opening of the heat sink to an air outlet opening of the heat sink. In this case, the heat sinks are spaced apart from each other by intermediate spaces and arranged one behind another in a row, in such a way that their air duct sections lie in a straight line and thus form a common air duct.

The electronic assembly comprises THT components. In power semiconductors, a distinction is made between surface-mounted devices (SMD) and THT components. THT devices, such as THT MOSFETs, stand upright on the PCB, i.e. the body of a THT device projects perpendicular from the PCB. In contrast, SMD components, e.g. SMD MOSFETs, are installed horizontally on the PCB, which is why they require significantly less installation space in terms of height, i.e. in the direction perpendicular to the PCB, than THT components. Surface-mounted devices typically dissipate heat through the printed circuit board; in THT components, however, the heat can dissipate directly into a heat sink arranged adjacent to the THT device, which typically results in more effective heat dissipation than with surface-mounted devices. THT components are therefore used, in particular, in applications with higher currents, in which a high level of heat loss occurs in the electronic component and for which effective heat dissipation must thus be ensured for trouble-free operation of the electronic component. A THT device can have a plate-shaped housing. The housing can be made of an electrically insulating material such as a polymer or plastic. The enclosure may have a front side, a rear side opposite the front side, and narrow sides that connect the front side and the rear side together. A THT device also has connection pins that can protrude from one of the narrow sides.

The THT components (THT=through-hole technology) can each be positioned with an outer side resting against an outer surface of one of the heat sinks. The connection pins of the THT components are secured in the printed circuit board. The electronic assembly comprises a fan, which is arranged such that an air stream generated thereby enters the air inlet opening of the heat sink that is arranged at the beginning of the row of heat sinks, and flows through the air duct formed by the row of heat sinks.

The invention is based on the finding that the use of THT power semiconductors provides better conditions for effective heat dissipation: For this purpose, the THT components projecting transversely to the plane of the printed circuit board are arranged with their outer sides resting in each case on an outer surface of a heat sink, so that a large-area heat-dissipating connection of the THT components to the heat sinks is achieved.

Because only THT devices at the same electrical potential rest against the same heat sink and the heat sinks are electrically insulated from one another, an electrical insulation film between a THT device and a heat sink can be omitted, which significantly improves the heat transfer from a THT device to a heat sink.

By means of these features according to the invention, the performance of an SC switching device can be significantly increased; therefore, considerably higher currents can be conducted through the SC switching device without causing excessive heating of the THT components.

According to the invention, the object is also achieved by an SC switching device having an electronic assembly according to any of the preceding claims. The SC switching device can be, for example, an electronic motor starter, a soft starter, an electronic miniature circuit breaker or a frequency converter. This list contains examples only and is neither exhaustive nor limiting. The SC switching device can be any device that has MOSFETS, thyristors, IGBTs or diodes and needs to be cooled.

Advantageous embodiments and refinements of the invention are specified in the dependent claims.

According to a preferred embodiment of the invention, the minimum distance between the heat sinks is selected in such a way that, depending on a potential difference between two adjacent heat sinks, sufficient flashover resistance is ensured and therefore no electrical flashover occurs between two adjacent heat sinks. Since the THT components are in electrically conductive contact with the heat sinks, an electrically conductive heat sink is at the electrical potential of the adjoining THT component(s). Parameters that influence the flashover resistance of air include the degree of contamination, air pressure, air humidity, etc. These dependencies are known to the person skilled in the art, who is able to determine an appropriate distance depending on the potential difference between two adjacent heat sinks. IEC60664-1 (version dated May 2020) defines suitable component distances as a function of an electrical voltage. Because only THT components at the same electrical potential are in contact with the same heat sink, usually only one THT component per heat sink, and the heat sinks are electrically insulated from each other, an electrical insulation film between a THT device and a heat sink can be omitted, thereby significantly improving the heat transfer from the THT device to the heat sink: the transition resistance is greatly reduced; this means that significantly higher currents can be conducted through the SC switching device without causing excessive heating of the THT components.

According to a preferred embodiment of the invention, the THT components are screwed onto the heat sinks or secured to the heat sinks with mounting clips.

According to a preferred embodiment of the invention, a free space is formed between at least one of the heat sinks and the printed circuit board, in which at least one electronic component is arranged. The heat sink is thus designed in such a way that a free space is arranged on the PCB side, which additionally keeps space clear for further electronic components.

According to a preferred embodiment of the invention, a free space is formed between at least one of the heat sinks and the printed circuit board, in which at least one electronic component is arranged. Thus, both THT components and SMD components can be used close to the heat sinks in the SC switching device.

According to a preferred embodiment of the invention, in the intermediate space between two adjacent heat sinks, comprising a first heat sink and a second heat sink, at least one electrically insulating sealing element is mounted in each case, which is designed such that flow losses of the air stream generated by the fan in the intermediate space between the air duct section of the first heat sink and the air duct section of the second heat sink are at least reduced. The individual heat sinks are thus combined with the sealing elements, i.e. by means of mountable intermediate pieces, to form an air duct closed over its entire length. Since the sealing elements are electrically insulating, the electrical insulation of the heat sinks against each other is still guaranteed. However, flow losses can be significantly minimized by the sealing elements, as the inflowing air is forcibly routed to the housing outlet and has no way of leaving the cooling channel by another route.

According to a preferred embodiment of the invention, at least one of the sealing elements consists of plastic. Plastic has the advantage that the sealing elements can be manufactured easily and cost-effectively, e.g. with an injection molding process, and are also reliably electrically insulating.

According to a preferred embodiment of the invention, the air duct formed by the heat sinks has openings through which an actuating shaft running transversely to the air duct can be inserted. In this case, an actuating shaft can be routed centrally through an opening transverse to the air duct from a front plate of the SC switching device to a mounting base of the SC switching device. This provides an operator with a simple means of mounting/dismounting a basic device of the SC switching device from a base unit of the SC switching device. This allows a proven solution for meeting the isolator characteristics to be maintained. It is possible that the openings on the air duct are sealed by a special shaping of the shaft.

According to a preferred embodiment of the invention, sealing devices, preferably sealing rings, are inserted into the openings, which are designed such that, with the actuating shaft inserted, flow losses of the air stream generated by the fan through the openings are at least reduced. The flow losses can be significantly minimized by the sealing devices, as the inflowing air is forcibly directed to the housing outlet and has no other way to leave the cooling channel.

Although the invention is illustrated and described herein as embodied in a electronic assembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
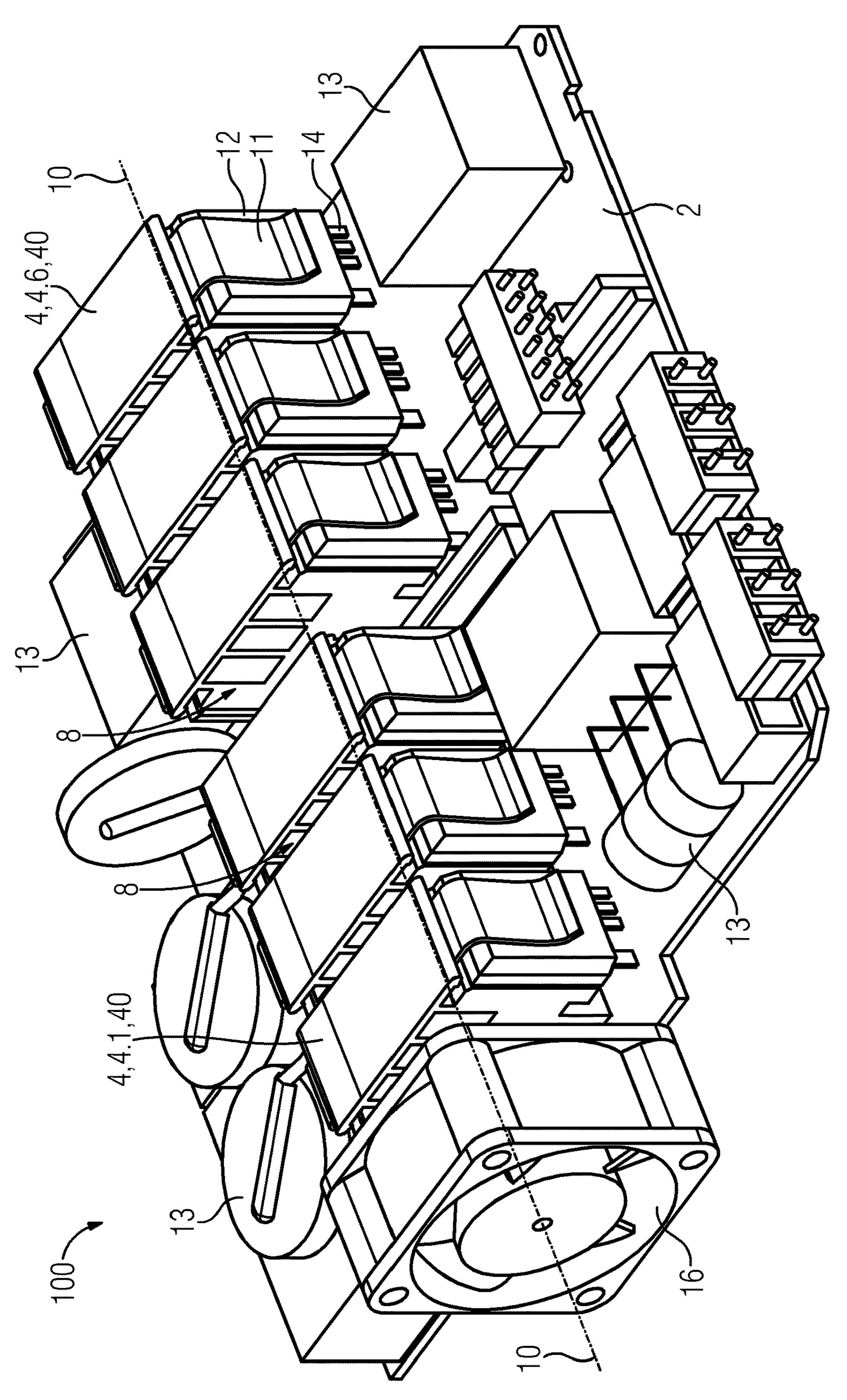
FIG. 1 is a perspective view of an electronic assembly.

Referring now to the figures of the drawing in detail and first, in particular, to FIG. 1 thereof, there is shown an electronic assembly 100. The electronic assembly 100 has a printed circuit board 2 with electronic components 12, 13 arranged on it. Six identical heat sinks 4 are also arranged on the printed circuit board 2.

Figure 2:
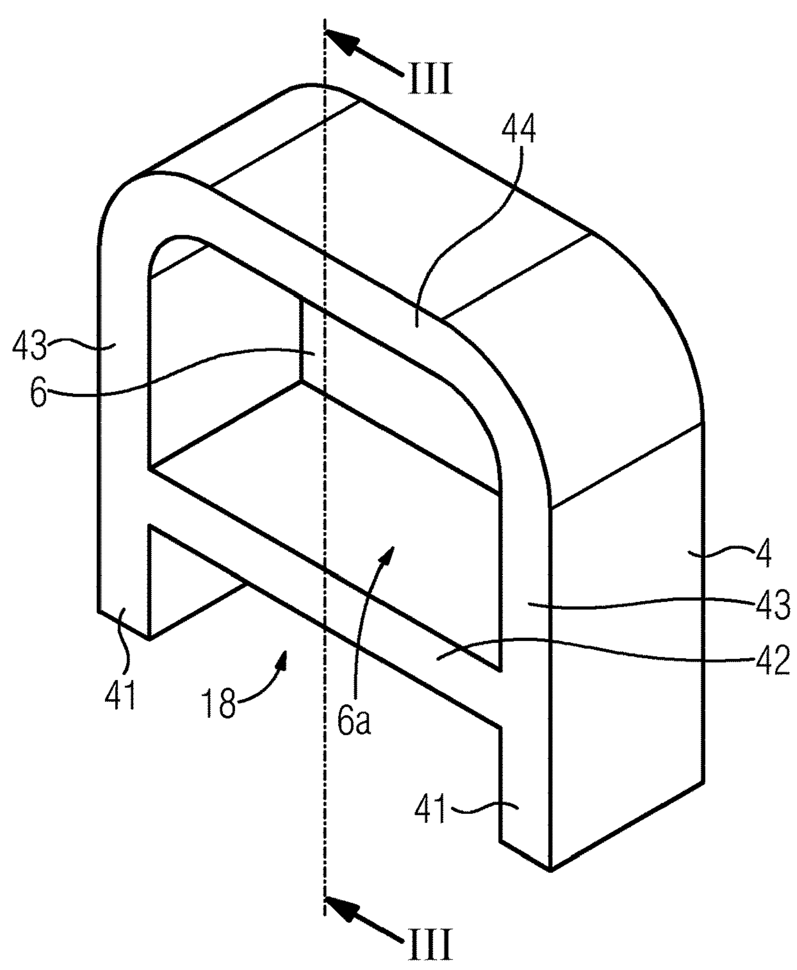
FIG. 2 shows a heat sink in an oblique view.
Figure 3:
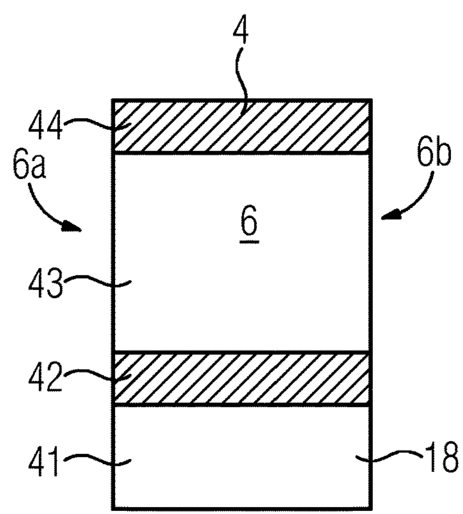
FIG. 3 shows a section through the heat sink of FIG. 2, taken along the plane defined by the line III.

FIG. 2 shows an oblique view of one of the six heat sinks 4. FIG. 3 shows the section III-III through the heat sink 4 shown in FIG. 2. FIGS. 2 and 3 reveal that the heat sinks 4 each have a straight duct-shaped air duct section 6, which extends from an air inlet opening 6*a* of the heat sink 4 to an air outlet opening 6*b* of the heat sink 4.

The heat sinks 4 arranged on the printed circuit board 2 are spaced apart from one another by intermediate spaces 8 and arranged in a row 40 one behind the other such that their air duct sections 6 lie on a straight line 10; in this way, the row 40 of the individual heat sinks 4 forms a common air duct 60.

The spacing distance between two adjacent heat sinks 4 is selected such that, depending on the potential difference between the two adjacent heat sinks 4, sufficient flashover resistance is guaranteed and thus no electrical flashover occurs between the two adjacent heat sinks 4. Parameters that influence the flashover resistance of air include the degree of contamination, air pressure, air humidity, etc. These dependencies are known to those of skill in the art, who are able to determine an appropriate distance depending on the potential difference between two adjacent heat sinks. Table F.8 of IEC 60664-1 (version dated May 2020) defines suitable component distances as a function of an electrical voltage. The inventors have found that in a specific experimental setup, a distance of 2.4 mm between two adjacent heat sinks at a potential difference of 3 kV (3,000 V) between the two adjacent heat sinks was sufficient. Due to possible manufacturing tolerances, the distance was set at 3 mm. These specific figures only represent one exemplary embodiment and are not to be seen as in any way limiting; in other embodiments, different conditions may exist that require different distances. In any case, however, a person skilled in the art is able to determine a minimum distance between two adjacent heat sinks for a given application, for example, by using the above-mentioned standard.

The electronic assembly 100 comprises THT components 12 (i.e., through-hole-technology components), which are each resting with a first outer side against an outer surface of one of the heat sinks 4; in this position, they are held in each case by a bow-shaped spring element 11 which is fixed with one end to the heat sink 4 and presses with its other end on a second outer side of the THT component 12 which is opposite the first outer side. The electrical connection pins 14 of the THT components 12 are each secured in the printed circuit board 2, where they are in electrical contact, e.g. by soldering, with conductor structures running in the printed circuit board 2.

The electronic assembly 100 also has an electrically driven fan 16, which is arranged such that an air stream generated thereby enters the air inlet opening 6*a* of the heat sink 4.1 that is arranged at the beginning of the row 40, and flows through the air duct 60 formed jointly by the row 40 of heat sinks 4 until it substantially flows out of the air outlet opening 6*b* of the heat sink 4.6 that is arranged at the end of the row 40.

In addition, further electronic components 13 are arranged on the printed circuit board 2. Further electronic components 13, e.g. SMD components, can also be arranged in a free space 18 below the air duct 60. FIGS. 2 and 3 show that the frontal view of a heat sink 4 has the shape of an A, wherein the free space 18 is located between feet 41 of the heat sink and below a base element 42 extending transversely across the feet 41. The air duct section 6 of the heat sink 4 is enclosed by side walls 43, which are adjoined to the feet 41, the base element 42 and a cover element 44.

FIGS. 2 and 3 show an embodiment of a heat sink 4, the cross-section of which has the shape of the letter "A". Two feet 41 support a base element 42, which corresponds to the cross beam of the "A". Two side walls 43 stand upright from the base element 42, which in turn support a cover element 44. The air duct section 6 of the heat sink 4 is enclosed by the base element 42, the side walls 43 and the cover element 44. Below the base element 42 is a free space 18 between the feet 41, in which at least one electronic component, e.g. an SMD component, can be arranged.

Figure 4:
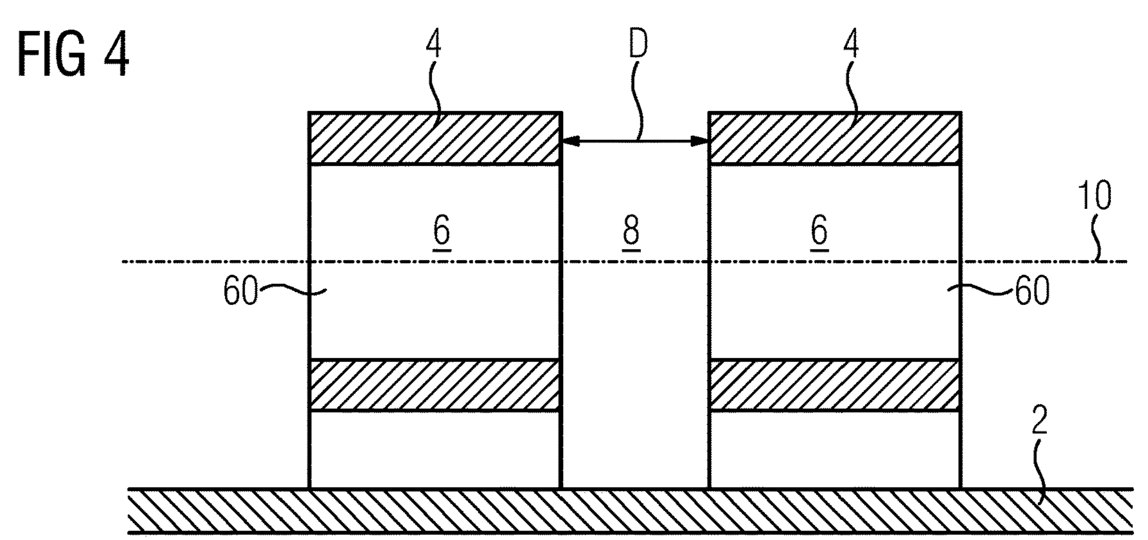
FIG. 4 shows a section through two adjacent heat sinks.

FIG. 4 shows a section along the longitudinal axis 10 of the air duct 60, which is formed by the air duct sections 6 of two adjacent heat sinks 4 that are arranged on a printed circuit board 2. Further heat sinks can be arranged to the left and/or right of the two illustrated heat sinks 4; for reasons of simplicity, only two heat sinks 4 are illustrated in FIG. 4. Between the two heat sinks 4 is an intermediate space 8, which has a width D measured along the longitudinal axis 10. By means of this intermediate space 8, the two heat sinks 4 are spaced apart from each other by the distance D, measured along the longitudinal axis 10.

Figure 5:
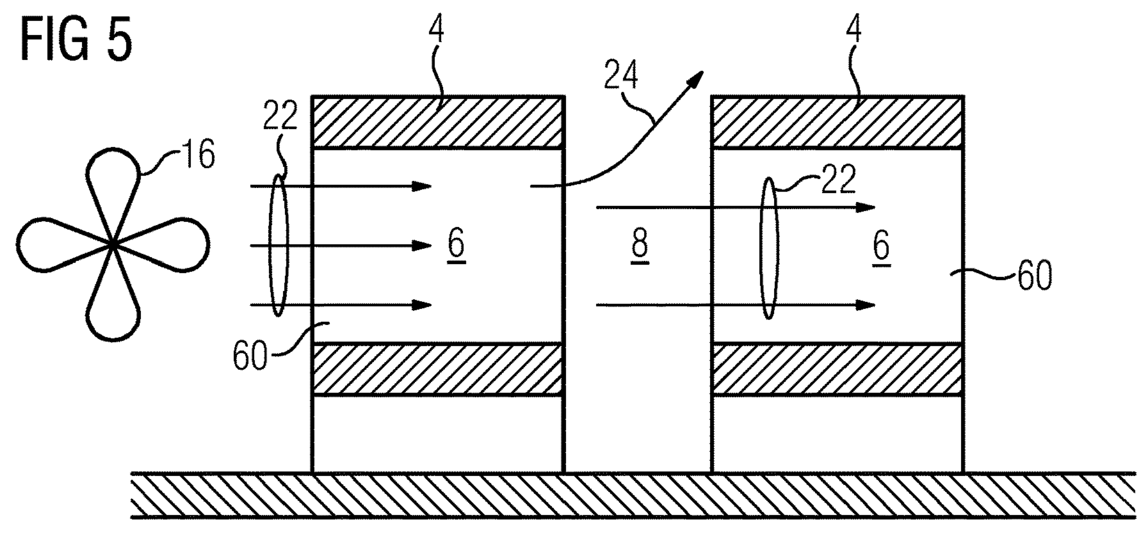
FIG. 5 shows a schematic illustration of an air stream through two adjacent heat sinks without a sealing element.

FIG. 5 shows an air stream 22, generated by a fan 16, which is represented by flow arrows. The air stream 22 flows through an air duct 60 formed by air duct sections 6 of two adjacent heat sinks 4. In this case, no sealing element for sealing the air stream 22 is arranged in the intermediate space 8 between the two heat sinks 4. For this reason, a portion 24 of the air stream 22 can escape from the air duct 60 in the intermediate space 8; the air stream 22 remaining in the air duct 60 becomes weaker as a result.

Figure 6:
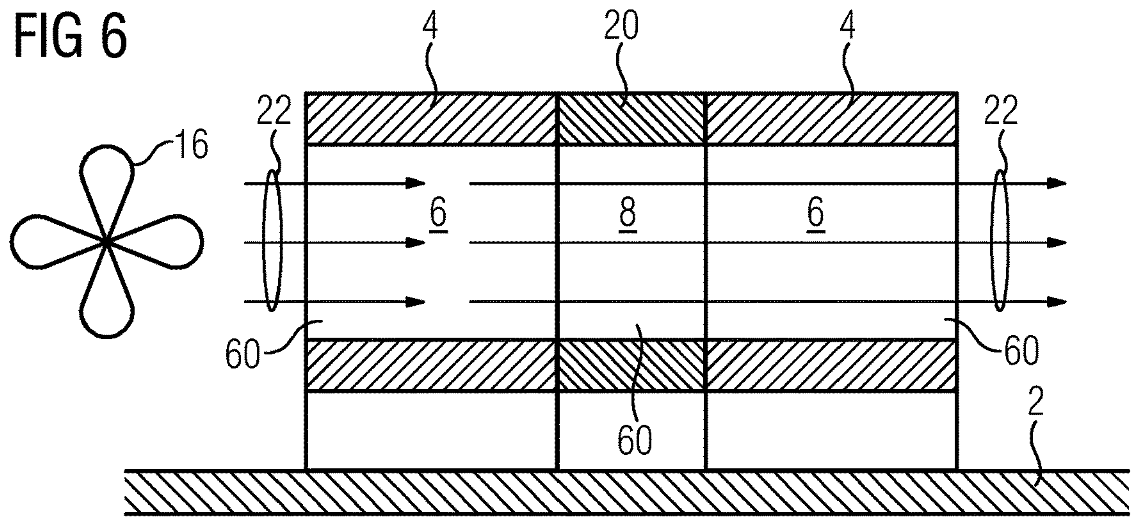
FIG. 6 shows a similar view of an air stream through two adjacent heat sinks with a sealing element.

FIG. 6 shows, based on the flow situation shown in FIG. 5, the case in which a sealing element 20 for sealing the air stream 22 is arranged in the intermediate space 8 between the two heat sinks 4. In this case, the sealing element 20 is designed such that its cross-section in the region of the air duct 60 matches the cross-sections of the identical heat sinks 4; in this way, the flow of the air stream 22 is not disturbed by projections and/or recesses and cross-section-reducing components, e.g. by generating turbulent flows. Due to the sealing element 20, the air stream 22 cannot escape from the air duct 60 in the intermediate space 8; the air stream 22 flowing in the air duct 60 thus remains unweakened.

Figure 7:
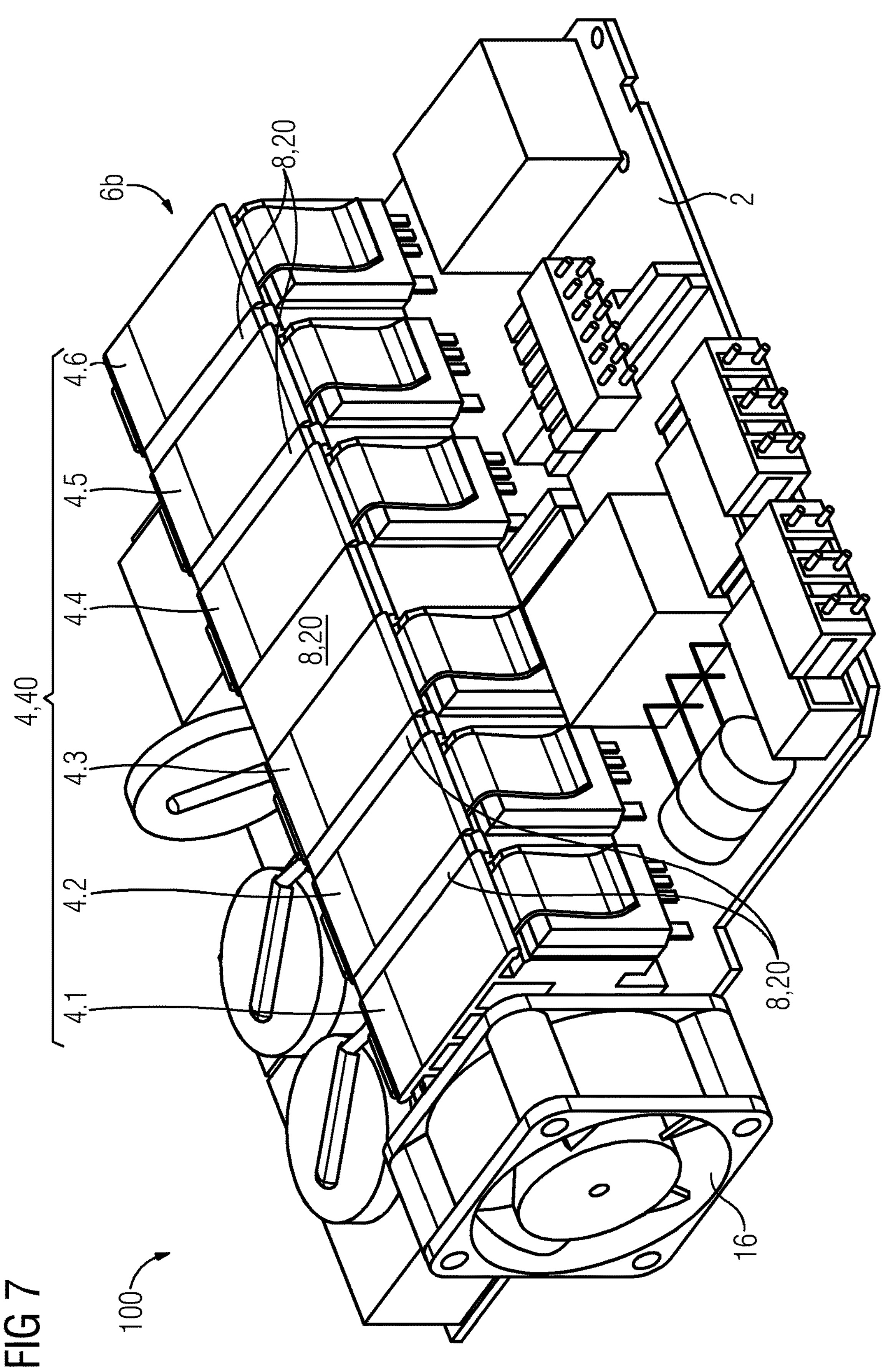
FIG. 7 shows the electronic assembly of FIG. 1 with sealing elements.

FIG. 7 shows the electronic assembly of FIG. 1, wherein sealing elements 20 are additionally inserted in the intermediate spaces 8 between the heat sinks 4. The intermediate spaces 8 between the first heat sink 4.1 of the row 40 and the second heat sink 4.2 of the row 40, between the second heat sink 4.2 of the row 40 and the third heat sink 4.3 of the row 40, between the fourth heat sink 4.4 of the row 40 and the fifth heat sink 4.5 of the row 40 and between the fifth heat sink 4.5 of the row 40 and the last heat sink 4.6 of the row 40, have the same width; therefore, they are sealed with identical sealing elements 20. However, the middle intermediate space 8 between the third heat sink 4.3 of the row 40 and the fourth heat sink 4.4 of the row 40 is much wider than the remaining intermediate spaces 8; therefore, it is sealed with a correspondingly wider sealing element 20, here formed by a stack of thinner sealing elements, which together attain the width of the middle intermediate space 8. Because sealing elements 20 are inserted in the intermediate spaces 8 between the heat sinks 4, an air stream generated by the fan 16 on leaving the air duct 60, i.e. at the air outlet opening 6*b* of the last heat sink 4.6 of the row 40, still has the same strength as when entering the air duct 60, that is, at the air inlet opening 6*a* of the first heat sink 4.1. The cooling effect of the air stream is therefore not weakened.

Figure 8:
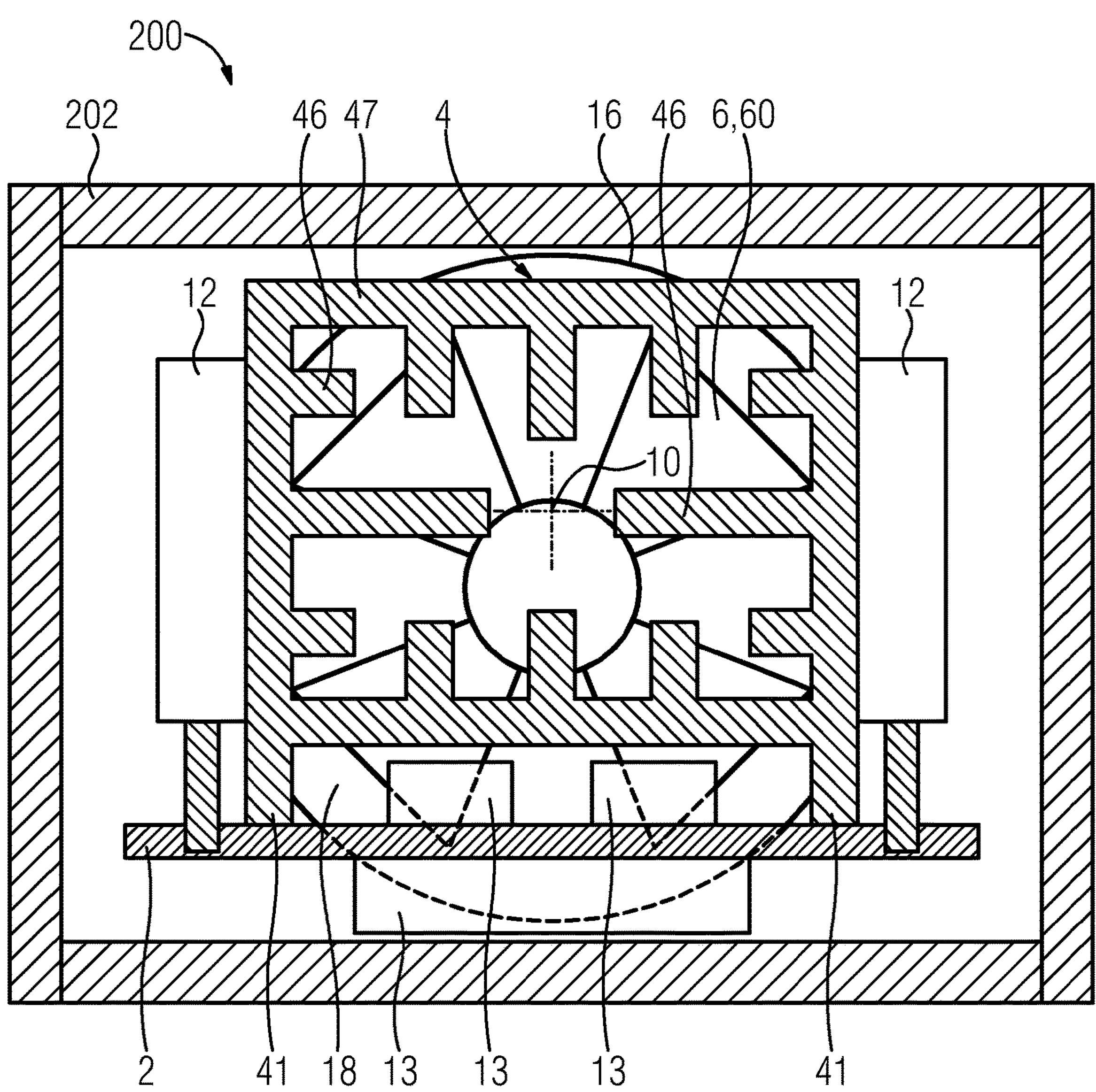
FIG. 8 shows a section through an SC switching device taken transversely to the air duct.

FIG. 8 shows a section through a cuboidal housing 202 of an SC switching device 200, wherein the cutting plane passes transversely to an air duct 60, which extends inside the housing 202. A printed circuit board 2 is located inside the housing 202. The air duct 60 is formed by a row 40 of heat sinks 4 which are arranged in a straight line on the printed circuit board 2. The heat sinks 4 have a cross-section in the shape of a rectangle, which has two feet 41 toward the printed circuit board 2, with which the heat sink 4 stands upright on the printed circuit board 2. Cooling fins 46 of different lengths protrude into the rectangular interior of the heat sinks 4 which form the common air duct 60, and are attached to the inner walls 47 of the heat sink 4. A THT component 12 rests against each outer side of the two side walls of the rectangular heat sink, to transfer waste heat to the heat sink 4 by means of heat conduction. In the free space 18 between the two feet 41 of the heat sink 4, two SMD components 13 are arranged, which are soldered to the printed circuit board 2. On the opposite side of the printed circuit board 2, a further electronic component 13 is arranged. In the interior of the housing 202, a fan 16 is arranged, which blows air along the longitudinal axis 10 of the air duct 60.

Figure 9:
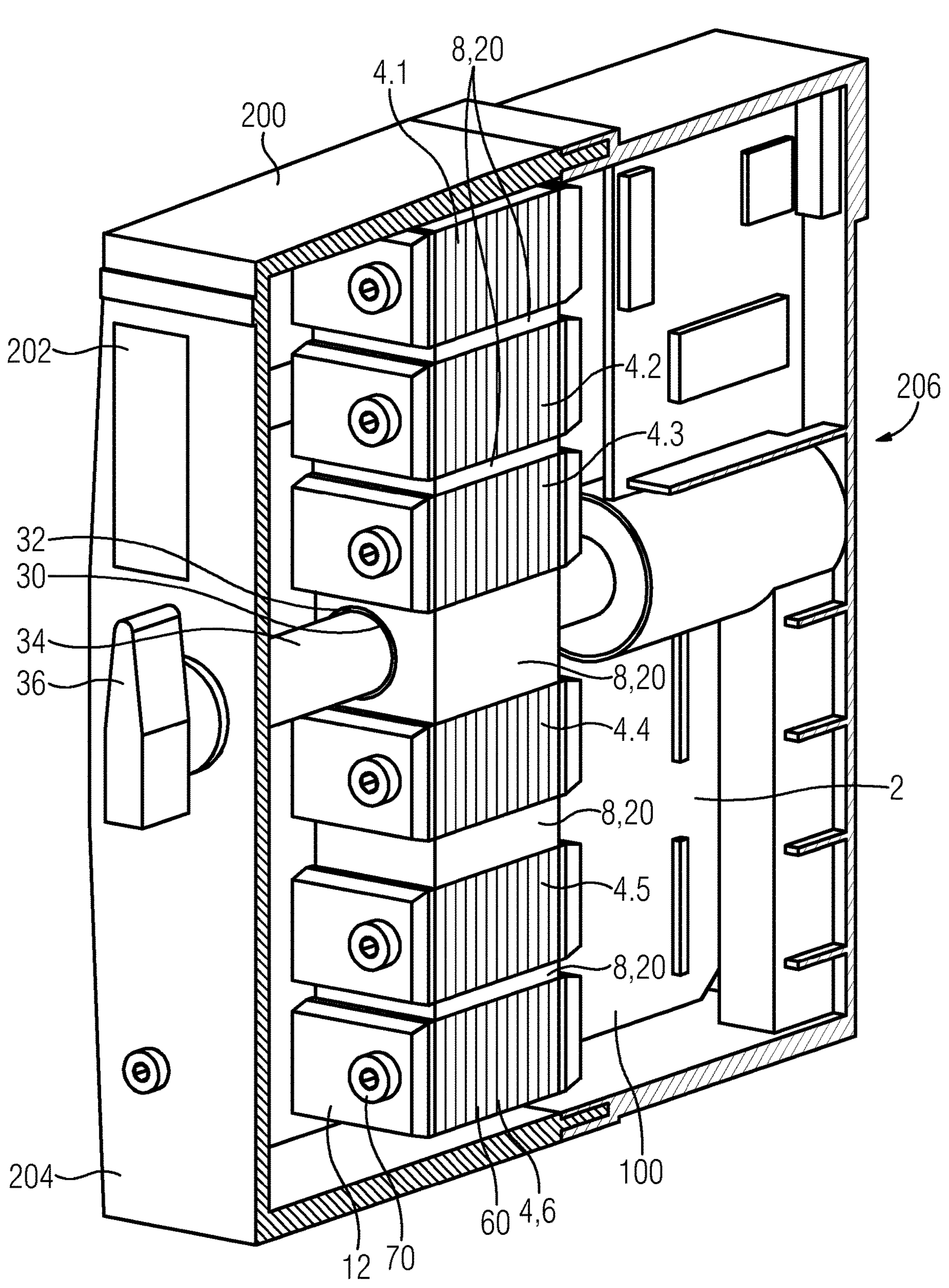
FIG. 9 shows a section through an SC switching device with an actuating shaft.

FIG. 9 shows a section through a housing 202 of an SC switching device 200, which has an actuating shaft 34 which extends from a front side 204 of the housing 202, which acts as the operating side of the SC switching device 200, to a rear side 206 of the housing 202. The actuating shaft 34 can be actuated by means of a toggle handle 36 which is arranged on a front-facing end of the actuating shaft 34. The actuating shaft 34 transversely penetrates an air duct 60 which is formed by a row of heat sinks 4.1 to 4.6 which are spaced apart from each other on a printed circuit board 2. Sealing elements 20 are inserted in the intermediate spaces 8 between the heat sinks 4.1 to 4.6 respectively, as is also shown in the exemplary embodiment of FIG. 7. The actuating shaft 34 penetrates such a sealing element 20. On the two narrow sides of the air duct 60, THT components 12 rest against each of the heat sinks 4.1 to 4.6, which are spaced so far away from the THT components 12 adjacent to them as to ensure a sufficient level of flashover resistance. The THT components 12 are pressed against the heat sinks 4.1 to 4.6 by fastening elements 70, e.g. screws, so strongly that an effective heat transfer from the THT components 12 to the heat sinks 4.1 to 4.6 is ensured.

In each of the two circular openings 30 of the air duct 60 through which the actuating shaft 34 passes, a sealing ring 32 is arranged in an annular gap, which extends between the wall of the air duct 60 and the actuating shaft 34, to prevent escape of the air stream flowing through the air duct 60.

Figure 10:
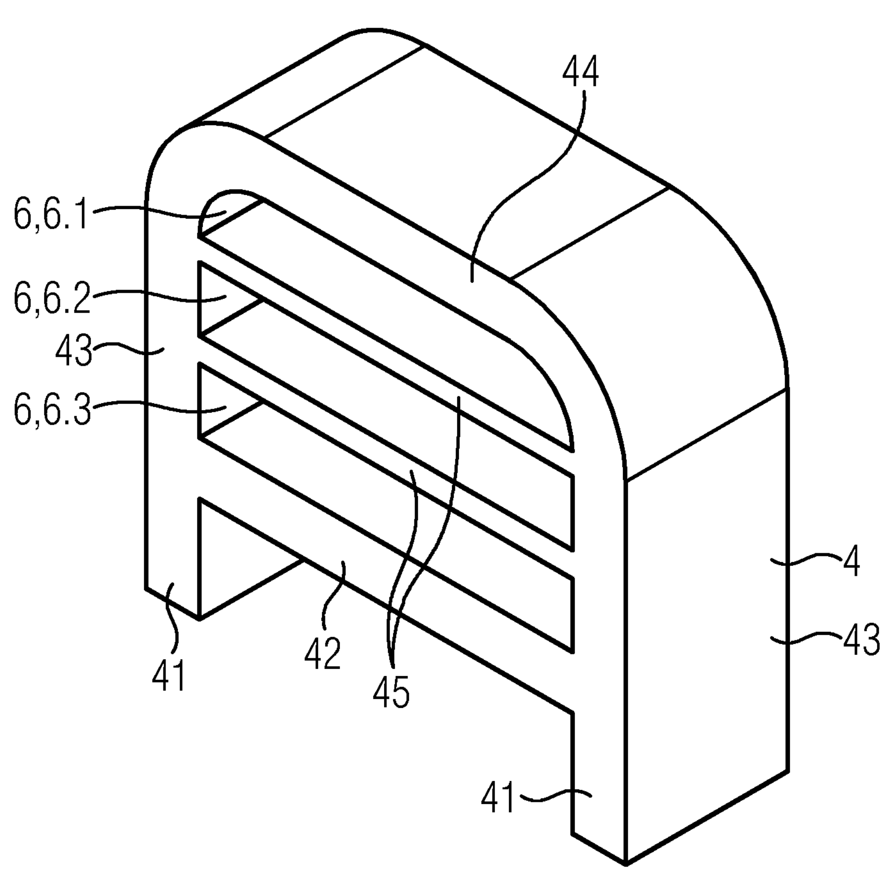
FIG. 10 shows an oblique view of a heat sink.

FIG. 10 shows an oblique view of a heat sink 4 according to an alternative embodiment. The outer shape of the heat sink 4 resembles the shape of the heat sink shown in FIG. 2, but in its interior, the heat sink 4 additionally has two wall ribs 45, which each extend horizontally through the air duct section 6 of the heat sink 4 from one side wall 43 to the other side wall 43. The wall ribs 45 divide the air duct section 6 into three branches 6.1, 6.2, 6.3. The wall fins 45 improve the stability of the heat sink 4 and increase the heat-transmitting surface of the heat sink 4, at which thermal energy from the heat sink 4 can be transmitted by forced convection to an air stream that flows through the air duct section 6. Because the THT components of an electronic assembly 100 are arranged so as to rest against the outer walls of the side walls 43 of the heat sink 4, the waste heat discharged by the THT components to the heat sink 4 can be efficiently directed by the horizontally running wall ribs 45 arranged on the side walls 43, to the air duct section 6 where it can be discharged to an air stream.

The invention claimed is:

1. An electronic assembly, comprising:

a circuit board;

two or more heat sinks disposed on said printed circuit board, each of said heat sinks having a straight air duct section extending from an air inlet opening of said heat sink to an air outlet opening of said heat sink, said heat sinks being disposed in a row, one behind another, and spaced apart from each other by intermediate spaces, with said air duct sections lying in a straight line and forming an air duct, through-hole-technology (THT) components each having an outer side resting against an outside surface of a respective one of said heat sinks and having connecting pins secured in said circuit board;

a fan disposed to generate an air stream to enter the air inlet opening of a respective said heat sink that is located at a beginning of said row, and to flow through the air duct; and wherein the air duct formed by said heat sinks is formed with openings to enable an actuating shaft running perpendicular to the air duct to be inserted through said openings.

2. The electronic assembly according to claim 1, wherein a minimum distance between said heat sinks is selected to ensure sufficient flashover resistance in dependence on a potential difference between mutually adjacent said heat sinks.

3. The electronic assembly according to claim 1, wherein a free space is formed between at least one of said heat sinks and said circuit board, and at least one electronic component is arranged in said free space.

4. The electronic assembly according to claim 3, wherein said at least one electronic component has a surface-mounted device (SMD) component.

5. The electronic assembly according to claim 1, which comprises:

at least one electrically insulating sealing element mounted in the intermediate space between two adjacent heat sinks, wherein the two adjacent heat sinks are a first heat sink and a second heat sink; and said at least one electrically insulating sealing element mounted between said first and second heat sinks being configured to reduce flow losses of the air stream generated by the fan in the intermediate space between the air duct section of said first heat sink and the air duct section of said second heat sink.

6. The electronic assembly according to claim 5, wherein said at least one electrically insulating sealing element mounted between said first and second heat sinks is configured to substantially prevent flow losses of the air stream generated by the fan in the intermediate space between the air duct section of said first heat sink and the air duct section of said second heat sink.

7. The electronic assembly according to claim 5, wherein at least one of the sealing elements is made of plastic.

8. The electronic assembly according to claim 1, which further comprises sealing devices inserted into said openings, said sealing devices being configured, with the actuating shaft inserted, to reduce flow losses of the air stream generated by said fan via said openings.

9. The electronic assembly according to claim 8, wherein said sealing devices are configured to substantially prevent flow losses of the air stream via said openings.

10. A semiconductor switching device, comprising an electronic assembly according to claim 1.

* * * * *